United States Patent
Ohata et al.

(10) Patent No.: US 8,227,089 B2
(45) Date of Patent: Jul. 24, 2012

(54) METHOD OF PRODUCING $NB_3SN$ SUPERCONDUCTING WIRE ROD, AND $NB_3SN$ SUPERCONDUCTING WIRE ROD

(75) Inventors: Katsumi Ohata, Tsuchiura (JP); Masahiro Seido, Tsuchiura (JP); Morio Kimura, Kasumigaura (JP)

(73) Assignee: Hitachi Cable, Ltd., Tokyo (JP)

( * ) Notice: Subject to any disclaimer, the term of this patent is extended or adjusted under 35 U.S.C. 154(b) by 38 days.

(21) Appl. No.: 12/973,297

(22) Filed: Dec. 20, 2010

(65) Prior Publication Data

US 2011/0190139 A1   Aug. 4, 2011

(30) Foreign Application Priority Data

Jan. 20, 2010   (JP) .................................. 2010-010134

(51) Int. Cl.
*B21D 39/00* (2006.01)
*H01L 39/24* (2006.01)

(52) U.S. Cl. ........... 428/614; 148/98; 505/231; 505/431
(58) Field of Classification Search ................ 148/98, 148/96; 428/614, 643, 644, 646; 505/231, 505/431, 510
See application file for complete search history.

(56) References Cited

U.S. PATENT DOCUMENTS

| 6,548,187 | B2 * | 4/2003 | Nagai et al. | 428/614 |
| 6,810,276 | B1 * | 10/2004 | Zeitlin | 505/231 |
| 6,849,137 | B2 * | 2/2005 | Iwaki et al. | 148/98 |
| 6,932,874 | B2 * | 8/2005 | Marancik et al. | 148/98 |

FOREIGN PATENT DOCUMENTS

JP   A-250749   9/1999

* cited by examiner

*Primary Examiner* — Colleen Dunn
(74) *Attorney, Agent, or Firm* — Scully, Scott, Murphy & Presser, PC

(57) ABSTRACT

A method of producing a $Nb_3Sn$ superconducting wire rod includes forming a wire rod comprising Nb, Sn and Cu, and having a mole ratio of the Sn expressed as $ax+b(1-x)$, where $0.25 \leq x \leq 0.8$, $0.3 \leq a \leq 0.4$ and $0.02 \leq b \leq 0.1$, and x and 1−x are prescribed as a mole ratio of the Nb and a mole ratio of the Cu, respectively, to a total of a mole number of the Nb and a mole number of the Cu, and heating the wire rod to produce $Nb_3Sn$ from the Sn and the Nb. By the heating of the wire rod, a Cu—Sn alloy is produced from the Sn and the Cu, concurrently with the $Nb_3Sn$ produced from the Sn and the Nb.

3 Claims, 7 Drawing Sheets

METHOD OF PRODUCING NB₃SN SUPERCONDUCTING WIRE ROD, AND NB₃SN SUPERCONDUCTING WIRE ROD

The present application is based on Japanese patent application No. 2010-010134 filed on Jan. 20, 2010, the entire contents of which are incorporated herein by reference.

BACKGROUND OF THE INVENTION

1. Field of the Invention

The present invention relates to a method of producing a $Nb_3Sn$ superconducting wire rod, and a $Nb_3Sn$ superconducting wire rod. In particular, it relates to a method for producing a high critical current $Nb_3Sn$ superconducting wire rod, which can be applied to a high magnetic field magnet, and a $Nb_3Sn$ superconducting wire rod.

2. Description of the Related Art

As a conventional $Nb_3Sn$ superconducting wire rod production method, a bronze method has been widely used. The bronze method is for wire drawing to structure a wire rod to have multiple Nb filaments arranged in a Cu—Sn alloy matrix, and subsequent heat treatment to thereby allow Sn in the Cu—Sn alloy to diffuse to react with the Nb filaments, to produce $Nb_3Sn$ in at least portions of the Nb filaments. However, because the upper limit of the Sn solid solution in the Cu—Sn alloy is on the order of 16 weight %, $Nb_3Sn$ cannot be produced more than that upper limit, and there has therefore also been a limit on enhancement of its critical current value (Ic), and the like.

Accordingly, a $Nb_3Sn$ superconducting wire rod production method has previously been known that comprises: forming a composite having stacked therein an alloy or intermetallic compound of Sn and one or two or more metals selected from the group of Ti, Zr, Hf, V, and Ta, and Nb or a Nb alloy; working this composite into a wire rod; and subsequently heating it, wherein the alloy or intermetallic compound of Sn and one or two or more metals selected from the group of Ti, Zr, Hf, V, and Ta has a Sn content ranging from 20 to 75 atom %.

The above $Nb_3Sn$ superconducting wire rod production method allows producing a superconducting wire rod having a $Nb_3Sn$ phase thicker and more excellent in high magnetic field characteristics than produced with the conventional bronze method.

Refer to JP Patent No. 3945600, for example.

In the above $Nb_3Sn$ superconducting wire rod production method, however, of the constituent materials of the $Nb_3Sn$ superconducting wire rod, the proportion of Sn required for $Nb_3Sn$ production is prescribed principally in relation to the amount of Nb, but determined regardless of the amount of Cu. That is, no constituent ratios between the constituent materials including Cu are prescribed. This may lead to excess and deficiency in the Sn amount, in which case there may be a decrease in the critical current density (Jc) of the resulting $Nb_3Sn$ superconducting wire rod, or unreacted Sn may remain in the superconducting wire rod, thereby leading to a decrease in the strength of the $Nb_3Sn$ superconducting wire rod.

SUMMARY OF THE INVENTION

In the above $Nb_3Sn$ superconducting wire rod production method, however, of the constituent materials of the $Nb_3Sn$ superconducting wire rod, the proportion of Sn required for $Nb_3Sn$ production is prescribed principally in relation to the amount of Nb, but determined regardless of the amount of Cu. That is, no constituent ratios between the constituent materials including Cu are prescribed. This may lead to excess and deficiency in the Sn amount, in which case there may be a decrease in the critical current density (Jc) of the resulting $Nb_3Sn$ superconducting wire rod, or unreacted Sn may remain in the superconducting wire rod, thereby leading to a decrease in the strength of the $Nb_3Sn$ superconducting wire rod.

Accordingly, it is an object of the present invention to provide a method of producing a $Nb_3Sn$ superconducting wire rod that can inhibit deterioration in properties due to Sn excess and deficiency, as well as a $Nb_3Sn$ superconducting wire rod.

(1) According to one embodiment of the invention, a method of producing a $Nb_3Sn$ superconducting wire rod comprises:

forming a wire rod comprising Nb, Sn and Cu, and having a mole ratio of the Sn expressed as $ax+b(1-x)$, where $0.25 \leq x \leq 0.8$, $0.3 \leq a \leq 0.4$ and $0.02 \leq b \leq 0.1$, and x and $1-x$ are prescribed as a mole ratio of the Nb and a mole ratio of the Cu, respectively, to a total of a mole number of the Nb and a mole number of the Cu; and heating the wire rod to produce $Nb_3Sn$ from the Sn and the Nb.

In the above embodiment (1) of the invention, the following modifications and changes can be made.

(i) By the heating of the wire rod, a Cu—Sn alloy is produced from the Sn and the Cu, concurrently with the $Nb_3Sn$ produced from the Sn and the Nb.

(2) According to another embodiment of the invention, a $Nb_3Sn$ superconducting wire rod comprises:

Nb, Sn, and Cu, the superconducting wire rod having a mole ratio of the Sn expressed as $ax+b(1-x)$, where $0.25 \leq x \leq 0.8$, $0.3 \leq a \leq 0.4$ and $0.02 \leq b \leq 0.1$, and x and $1-x$ are prescribed as a mole ratio of the Nb and a mole ratio of the Cu, respectively, to a total of a mole number of the Nb and a mole number of the Cu.

Points of the Invention

According to one embodiment of the invention, an $Nb_3Sn$ superconducting wire rod is produced in consideration of the following factors. The wire rod produced is a composite of Nb, Sn, and Cu. When the wire rod is heated, Nb and Sn react to produce $Nb_3Sn$, while at the same time, Sn and Cu are alloyed to produce a Cu—Sn alloy. Thus, since the amount of Sn required for wire rod production is a total of the amount of Sn in $Nb_3Sn$ produced from Nb and Sn, and the amount of Sn in the Cu—Sn alloy produced from Cu and Sn, it is desirable to set the ratio of Sn, taking account of the production of the $Nb_3Sn$ and the Cu—Sn alloy. By prescribing the Sn mole ratio with the Nb and Cu mole ratios as claimed, it is possible to inhibit deterioration in the properties of the $Nb_3Sn$ superconducting wire rod due to Sn excess and deficiency.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Abstract of the Embodiment

Figure 1:
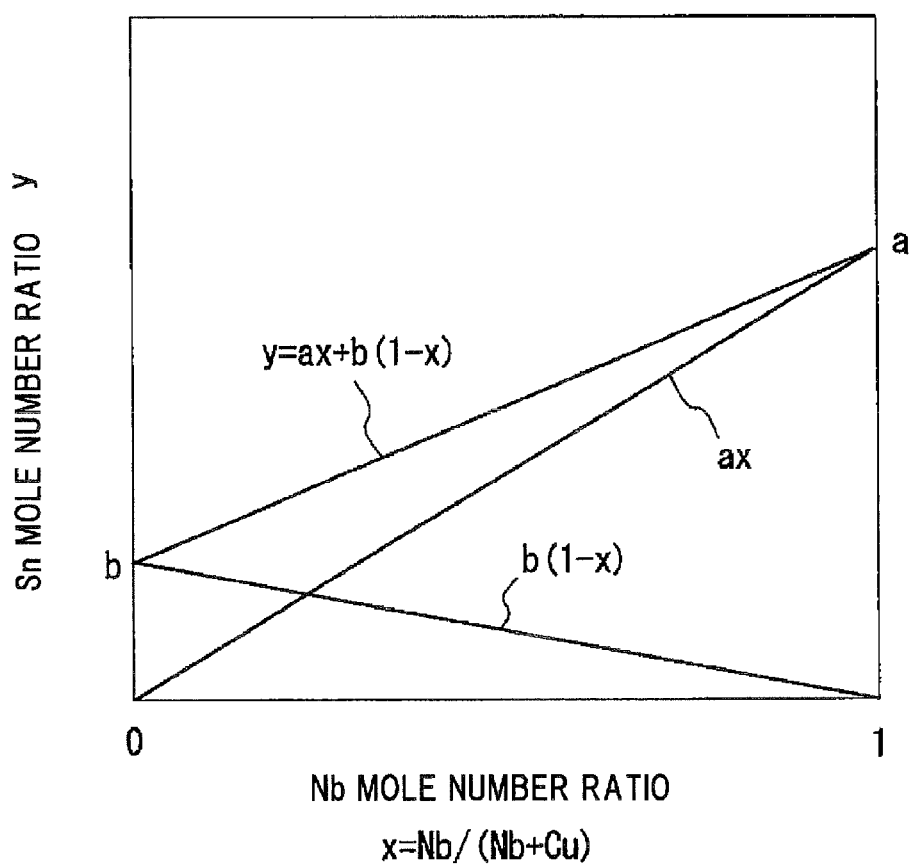
FIG. 1 is a diagram showing a method for prescribing a Sn ratio when producing a $Nb_3Sn$ superconducting wire rod in an embodiment according to the invention.

A method for producing a $Nb_3Sn$ superconducting wire rod having therein a Sn supply portion excluding bronze is provided that comprises: preparing metal materials containing Nb, Sn, and Cu, respectively; forming a wire rod containing the Nb, the Sn, and the Cu, and having a mole ratio of the Sn expressed as ax+b(1−x) (where $0.25 \leq x \leq 0.8$, $0.3 \leq a \leq 0.4$, $0.02 \leq b \leq 0.1$) where x and 1−x are prescribed as a mole ratio of the Nb and a mole ratio of the Cu, respectively, to a total of a mole number of the Nb and a mole number of the Cu; and heating the wire rod to produce $Nb_3Sn$ from the Sn and the Nb.

$Nb_3Sn$ Superconducting Wire Rod Production Process

A $Nb_3Sn$ superconducting wire rod production process in an embodiment of the invention is outlined as follows: In a material preparing step, there are first prepared metal materials containing constituent elements Nb, Sn, and Cu, respectively, principally of which a $Nb_3Sn$ superconducting wire rod is composed. The Nb serves to react with the Sn to produce $Nb_3Sn$, while the Cu is used as a matrix material into which the Nb (e.g. filamented Nb) and the Sn are buried. The Cu serves to spatially separate $N_3Sn$ filaments produced by heat treatment described later, to prevent the $Nb_3Sn$ filaments from contacting each other. When an internal diffusion method described later is used, the Cu serves as a diffusion path to diffuse the Sn to the Nb filaments.

Then, by using the metal materials, a wire rod is formed that contains the Nb, the Sn, and the Cu, and has a mole ratio of the Sn expressed as "ax+b(1−x)" (where $0.25 \leq x \leq 0.8$, $0.3 \leq a \leq 0.4$, $0.02 \leq b \leq 0.1$) where x and 1−x are prescribed as a mole ratio of the Nb and a mole ratio of the Cu, respectively, to a total of a mole number of the Nb and a mole number of the Cu. This wire rod is a composite of the Nb, the Sn, and the Cu. Following that, in a heat treatment step, the wire rod formed is heated to thereby produce $Nb_3Sn$ from the Sn and the Nb, while producing a Cu—Sn alloy from the Sn and the Cu. In the heat treatment step, it is preferred to produce the Cu—Sn alloy, concurrently with producing the $Nb_3Sn$.

In this embodiment, since Cu is used as a matrix material, the heat treatment temperature in the heat treatment step can, in a Nb tube method described later and a Jelly Roll method described later, be decreased, compared to no Cu used. That is, in the case of a direct reaction of Nb and Sn with no Cu used, a high heat treatment temperature of the order of 900° C. is necessary for $Nb_3Sn$ production. On the other hand, the $Nb_3Sn$ superconducting wire rod production method in this embodiment allows the composite of the Nb and the Sn with the Cu to decrease the heat treatment temperature in the heat treatment step to 650° C. to 750° C.

The above production process results in a $Nb_3Sn$ superconducting wire rod containing the Nb, the Sn, and the Cu, and having a mole ratio of the Sn expressed as ax+b(1−x) (where $0.25 \leq x \leq 0.8$, $0.3 \leq a \leq 0.4$, $0.02 \leq b \leq 0.1$) where x and 1−x are prescribed as a mole ratio of the Nb and a mole ratio of the Cu, respectively, to a total of a mole number of the Nb and a mole number of the Cu.

The $Nb_3Sn$ superconducting wire rod production method in the embodiment of the invention may use an internal diffusion method, a Nb tube method, or a Jelly Roll method.

Internal Diffusion Method

The internal diffusion method first arranges a plurality of Nb filaments inside a Cu matrix. Further, substantially at the center of the Cu matrix, there is arranged a Sn or Sn alloy layer as a Sn supply source. This results in a subelement wire. Following that, a multicore wire rod is fabricated by binding a plurality of subelement wires. The resulting multicore wire rod is then heated to thereby diffuse Sn in the Sn or Sn alloy layer toward the Nb filaments through the Cu matrix. This results in a $Nb_3Sn$ superconducting wire rod having $Nb_3Sn$ produced in portions of the Nb filaments.

Nb Tube Method

The Nb tube method first accommodates Sn and Cu inside a Nb tube. A plurality of Nb tubes with Sn and Cu accommodated therein are prepared. A wire rod having arranged in a Cu matrix the plural Nb tubes with Sn and Cu accommodated therein is then prepared. That wire rod is then heated to thereby react Sn in the Nb tubes with Nb, to produce $Nb_3Sn$ in inner portions of the Nb tubes, or the entire Nb tubes. This results in a $Nb_3Sn$ superconducting wire rod.

Jelly Roll Method

The Jelly Roll method first prepares a Nb sheet formed of Nb or a Nb alloy, a Sn sheet formed of Sn or a Sn alloy, and a core formed of a specified metal material, around which the Nb sheet and the Sn sheet are to be wrapped. The Nb sheet and the Sn sheet are then wrapped around the core many times. A wire rod is fabricated by further providing a Nb or Nb alloy, or Ta diffusion barrier layer and a Cu stabilization layer around the core having the Nb sheet and the Sn sheet wrapped therearound. That wire rod is then drawn and heated to thereby produce $Nb_3Sn$ from the Nb sheet and the Sn sheet. This results in a $Nb_3Sn$ superconducting wire rod.

Sn Ratio Prescribing Method

Here, in the $Nb_3Sn$ superconducting wire rod production method in the embodiment of the invention, to ensure the optimization of the critical current density (Jc) of a $Nb_3Sn$ superconducting wire rod produced by supplying Nb with a proper amount of Sn, the Sn ratio is prescribed as follows.

FIG. 1 shows one example of a method for prescribing the Sn ratio when producing a $Nb_3Sn$ superconducting wire rod in the embodiment according to the invention.

The wire rod fabricated in the wire rod forming step is a composite of Nb, Sn, and Cu. Here, when this wire rod is heated, Nb and Sn react to produce $Nb_3Sn$, while at the same time, Sn and Cu are alloyed to produce a Cu—Sn alloy. Here, the Sn ratio in the Cu—Sn alloy exceeds 0 atomic number %, and the upper limit of the Sn solid solution in the Cu—Sn alloy is 9 atomic number %. In many cases, the Sn ratio calculated from a composition analysis of that wire rod after the heat treatment is typically not less than 2 atomic number % and not more than 6 atomic number %.

Accordingly, since the amount of Sn required for wire rod production is a total of the amount of Sn in the $Nb_3Sn$ produced from Nb and Sn, and the amount of Sn in the Cu—Sn alloy produced from Cu and Sn, it is desirable to set the Sn ratio, taking account of the production of the $Nb_3Sn$ and the Cu—Sn alloy.

Here, let x be the ratio of the mole number of Nb to the total of the mole number of Nb and the mole number of Cu in the composite, then the ratio of the mole number of Cu is 1−x. Since the mole number of Sn required for $Nb_3Sn$ production is proportional to the mole number of Nb, let "a" be a proportional coefficient, then the mole number of Sn required for $Nb_3Sn$ production is represented by "a·x." Also, let "b" likewise be a proportional coefficient, then the mole number of Sn required for Cu—Sn alloy production is represented by "$b \cdot (1-x)$." Therefore, the mole number "y" of Sn required for Nb$_3$Sn superconducting wire rod production in this embodiment is represented by "$y = a \cdot x + b \cdot (1-x)$."

This relation is shown in FIG. 1. The ratio of the mole number of Sn to the ratio x of the mole number of Nb is represented by the straight line indicated by ax, while the ratio of the mole number of Sn to the ratio 1−x of the mole number of Cu is represented by the straight line indicated by b(1−x). The total of the mole number of Sn to the ratio x of the mole number of Nb, and the mole number of Sn to the ratio 1−x of the mole number of Cu is represented by the straight line "$y = a x + b (1-x)$."

Here, the value for the proportional coefficient a, which is a ratio of the mole number of Sn to the mole number of Nb, is preferably not less than 0.25 and not more than 0.5, more preferably not less than 0.3 and not more than 0.4, which is close to ⅓, which is a stoichiometric ratio. Also, the possible Sn concentration in the Cu—Sn alloy exceeds 0 atomic number % and is not more than 9 atomic number %, which is equivalent to exceeding approximately 0 and being not more than 0.1 in the proportional coefficient b, which is a ratio of the mole number of Sn to the mole number of Cu.

When the b is equal or close to 0, i.e., when the composition is assumed as containing no Sn in the Cu, the Sn is taken by wire rod heat treatment into the Cu, to cause a deficiency in Sn for Nb$_3$Sn production, which may result in no sufficient Nb$_3$Sn production. Also, the b value being great, e.g. greater than 0.1 causes an excess in Sn, which may partially produce a hard compound phase such as Cu$_5$Sn$_6$ to worsen the filament shape of Nb$_3$Sn. It is therefore preferable that the proportional coefficient b value be not less than 0.02 and not more than 0.1.

Here, the volume ratio of bronze and Nb in the bronze method is approximately 2:1. Significantly, Nb$_3$Sn is produced in this embodiment more than in the bronze method, to thereby enhance the superconductive properties of the Nb$_3$Sn superconducting wire rod. Thus, it is preferable that the Nb volume ratio in this embodiment be more than in the bronze method. It is therefore preferable that the mole ratio of Sn be x=0.25 or more in the Nb$_3$Sn superconducting wire rod production method in this embodiment. Also, when the amount of Nb is large and the amount of Cu is small, after Sn is diffused to the Nb, voids remain, and when the superconducting wire rod is used, there is considered to be a possibility that the mechanical strength of the wire rod decreases to cause deterioration in properties. It is therefore desirable that the upper limit of the x value be not more than 0.8. For the foregoing reasons, it is preferable that the x ranges from not less than 0.25 to not more than 0.8. The preferable ranges of a, b, and x explained above are shown in FIG. 2.

Figure 2:
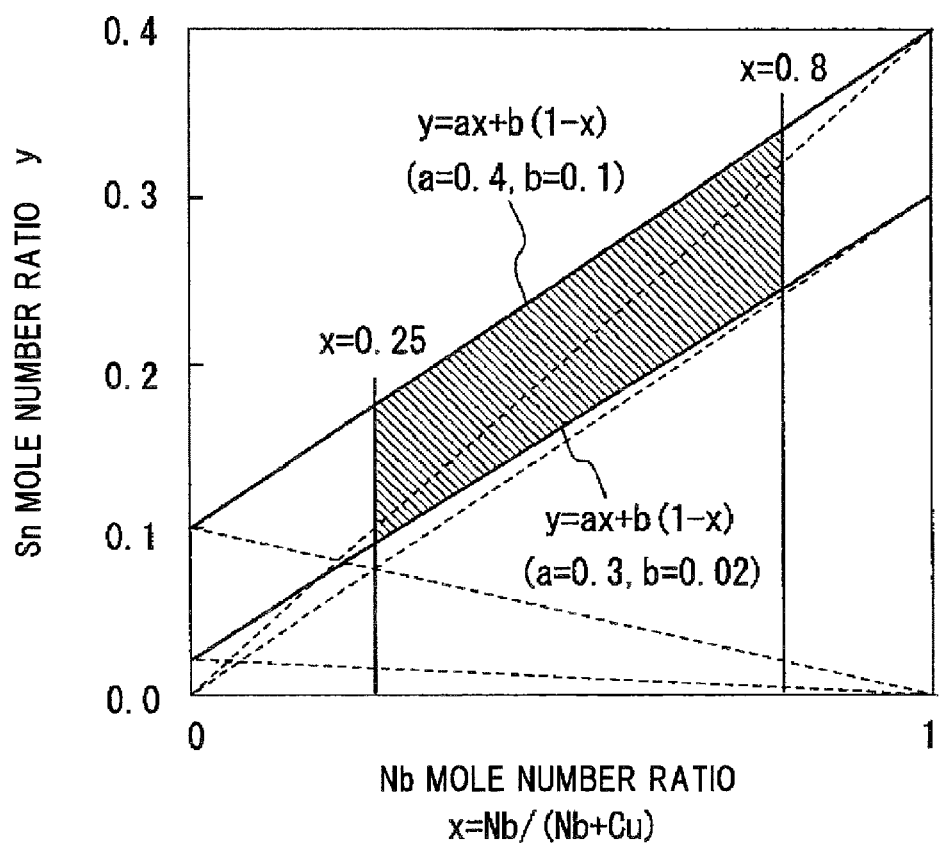
FIG. 2 is a diagram showing an optimum range of the Sn ratio when producing the $Nb_3Sn$ superconducting wire rod in the embodiment according to the invention.

FIG. 2 shows an optimum range of the Sn ratio when producing the Nb$_3$Sn superconducting wire rod in the embodiment according to the invention.

For the a, b, and x, the mole number ratio of each element may be converted into its volume ratio, and the above relation is equivalent to being prescribed as a volume ratio relation. That is, in the same manner as the case of the mole ratio, let X and 1−X be the volume ratios of Nb and Cu respectively, then the volume ratio Y of Sn required for Nb$_3$Sn superconducting wire rod production is represented by "$Y = A \cdot X + B \cdot (1-X)$," and can be calculated from the volume ratios of Nb and Cu.

Here, $A = a \cdot (M_3/\rho_3)/(M_1/\rho_1)$, $B = b \cdot (M_3/\rho_3)/(M_2/\rho_2)$, a and b are the above-described proportional coefficients, M is the atomic weight of each material, ρ is the density of each material, subscripts 1, 2, and 3 represent Nb, Cu, and Sn respectively, $M_1 = 92.906$, $M_2 = 63.546$, $M_3 = 118.71$, $\rho_1 = 8.57$ g/cm$^3$, $\rho_2 = 8.96$ g/cm$^3$, and $\rho_3 = 7.31$ g/cm$^3$ (For the values of atomic weight and density, see Chronological Scientific Tables, National Astronomical Observatory of Japan, Maruzen, H. 21).

Calculating the A and B ranges with the above relations, values, and the proportional coefficient a and b ranges, it is preferable that the A·ranges from not less than 0.37 to not more than 0.75, more preferably from not less than 0.45 to not more than 0.6, while the B ranges from not less than 0 to not more than 0.23, more preferably from not less than 0.04 to not more than 0.23. Also, the volume ratio X of Nb is represented by the relation below using the mole number ratio x.

$$X = 1/\{1 + (1-x)/x \cdot (M_2/\rho_2)/(M_1/\rho_1)\}$$

Deriving the X range from this relation and the x range, it is preferable that the X ranges from not less than 0.35 to not more than 0.85. The area defining the constituent ratio between Nb, Cu and Sn is an inner area relative to a barrier including a diffusion barrier layer provided to prevent the Sn from diffusing to the Cu serving to provide stabilization, or an inner area relative to a barrier not including the diffusion barrier layer.

Mole Ratio Calculating Method

Here, the mole ratio calculating method is described in more detail. Let $m_1$ and $m_2$ be the mole number of Nb and the mole number of Cu respectively in the composite. The mole number of Sn required for Nb$_3$Sn production from Nb is prescribed as being proportional to the mole number of Nb, i.e. the mole number of Sn is represented by $a \cdot m_1$ where a is a proportional coefficient. When the stoichiometric ratio is Nb:Sn=3:1, i.e. when Nb$_3$Sn is produced, a=⅓. Also, the mole number of Sn required for Cu—Sn alloy production from Cu is likewise represented by $b \cdot m_2$ where b is a proportional coefficient. Combine both of these together, then the mole number $m_3$ of Sn required is represented by the following equation.

$$m_3 = a \cdot m_1 + b \cdot m_2 \quad \text{(Eq. 1.1)}$$

Of this, let the ratio of the mole number of Nb be represented by x, the ratio of the mole number of Cu is then 1−x. The ratio x of the mole number of Nb and the ratio 1−x of the mole number of Cu are represented by the following equations, respectively.

$$x = m_1/(m_1 + m_2) \quad \text{(Eq. 1.2)}$$

$$1 - x = m_2/(m_1 + m_2) \quad \text{(Eq. 1.3)}$$

Eqs. 1.2 and 1.3 may be rewritten as the following equations, respectively.

$$m_1 = x \cdot (m_1 + m_2) \quad \text{(Eq. 1.4)}$$

$$m_2 = (1-x) \cdot (m_1 + m_2) \quad \text{(Eq. 1.5)}$$

Substituting Eqs. 1.4 and 1.5 in Eq. 1.1 yields the following equation.

$$m_3 = a \cdot x \cdot (m_1 + m_2) + b \cdot (1-x) \cdot (m_1 + m_2)$$

$$m_3 = (a \cdot x + b \cdot (1-x)) \cdot (m_1 + m_2) \quad \text{(Eq. 1.6)}$$

Hence, the ratio y of the mole number of Sn to the sum of the mole number of the Nb and the mole number of the Cu can be represented by the following equation.

$$y = m_3/(m_1 + m_2) = a \cdot x + b \cdot (1-x) \quad \text{(Eq. 1.7)}$$

From Eqs. 1.2, 1.3, and 1.6, the ratio of the mole number of each element Nb, Cu, and Sn, x, 1−x, and $y = a \cdot x + b \cdot (1-x)$ can be obtained.

Volume Ratio Calculating Method

Also, the volume ratio calculating method is described in more detail. The mole ratio may be converted into its volume ratio. First, let m be the mole number of each material, M the atomic weight of each material, ρ the density of each material, and V the volume of each material, then V=m·M/ρ. Let the materials Nb, Cu, and Sn be represented by subscripts 1, 2, and 3 respectively, the volumes of the materials are then represented by the following equations, respectively.

$$V_1 = m_1 \cdot M_1 / \rho_1 \quad \text{(Eq. 2.1)}$$

$$V_2 = m_2 \cdot M_2 / \rho_2 \quad \text{(Eq. 2.2)}$$

$$V_3 = m_3 \cdot M_3 / \rho_3 \quad \text{(Eq. 2.3)}$$

Substituting Eqs. 2.1, 2.2, and 2.3 in Eq. 1.1 yields the following equation.

$$V_3 / (M_3/\rho_3) = a \cdot V_1 / (M_1/\rho_1) + b \cdot V_2 / (M_2/\rho_2) \quad \text{(Eq. 2.4)}$$

Let X be the ratio of the volume of Nb to the total of the volume of Nb and the volume of Cu, the ratio of the volume of Cu is then 1−X. The volume ratio X of Nb and the volume ratio 1−X of Cu are represented by the following equations, respectively.

$$X = V_1 / (V_1 + V_2) \quad \text{(Eq. 2.5)}$$

$$1 - X = V_2 / (V_1 + V_2) \quad \text{(Eq. 2.6)}$$

Eqs. 2.5 and 2.6 may be rewritten as the following equations, respectively.

$$V_1 = X \cdot (V_1 + V_2) \quad \text{(Eq. 2.7)}$$

$$V_2 = (1 - X) \cdot (V_1 + V_2) \quad \text{(Eq. 2.8)}$$

Substituting Eqs. 2.7 and 2.8 in Eq. 2.4 yields the following equation.

$$V_3 = \{a \cdot X \cdot (M_3/\rho_3)/(M_1/\rho_1) + b \cdot (1-X) \cdot (M_3/\rho_3)/(M_2/\rho_2)\} \cdot (V_1 + V_2)$$

$$V_3 = (A \cdot X + B \cdot (1-X)) \cdot (V_1 + V_2) \quad \text{(Eq. 2.9)}$$

Hence, the ratio Y of the volume of Sn to the sum of the volume of the Nb and the volume of the Cu can be represented by the following equation.

$$Y = V_3 / (V_1 + V_2) = A \cdot X + B \cdot (1-X) \quad \text{(Eq. 2.10)}$$

From Eqs. 2.5, 2.6, and 2.10, the ratio of the volume of each element Nb, Cu, and Sn, X, 1−X, and Y=A·X+B·(1−X) can be obtained.

Here, $A = a \cdot (M_3/\rho_3)/(M_1/\rho_1)$, $B = b \cdot (M_3/\rho_3)/(M_2/\rho_2)$, a and b are the above-described proportional coefficients, M is the atomic weight of each material, ρ is the density of each material, subscripts 1, 2, and 3 represent Nb, Cu, and Sn respectively, $M_1 = 92.906$, $M_2 = 63.546$, $M_3 = 118.71$, $\rho_1 = 8.57$ g/cm$^3$, $\rho_2 = 8.96$ g/cm$^3$, and $\rho_3 = 7.31$ g/cm$^3$ (For the values of atomic weight and density, see Chronological Scientific Tables, National Astronomical Observatory of Japan, Maruzen, H. 21).

Substituting Eqs. 2.1 and 2.2 in Eq. 2.5 yields the following equation, from which the relation between X and x is derived as follows.

$$X = m_1 \cdot (M_1/\rho_1) / (m_1 \cdot (M_1/\rho_1) + m_2 \cdot (M_2/\rho_2)) \quad \text{(Eq. 3.1)}$$

$$= 1 / (1 + m_2/m_1 \cdot (M_2/\rho_2)/(M_1/\rho_1))$$

Eq. 1.2 may be rewritten as the following equation.

$$x = 1/(1 + m_2/m_1)$$

$$m_2/m_1 = (1-x)/x \quad \text{(Eq. 3.2)}$$

Substituting Eq. 3.2 in Eq. 3.1 yields the following relation.

$$X = 1/(1 + (1-x)/x \cdot (M_2/\rho_2)/(M_1/\rho_1)) \quad \text{(Eq. 3.3)}$$

Advantages of the Embodiment

In the Nb$_3$Sn superconducting wire rod production method in this embodiment, the atomic number ratio y of Sn to Nb and Cu is prescribed as y=a·x+b·(1−x), where x is prescribed as the atomic number ratio of Nb to Nb and Cu, i.e. x=Nb/(Nb+Cu), and the a and b numerical values are limited into the specified ranges respectively. It is therefore possible to inhibit deterioration in the properties of the superconducting wire rod due to deficiency in the Sn concentration.

Example 1

A Nb$_3$Sn superconducting wire rod in Example 1 is produced, using the internal diffusion method.

Figure 3:
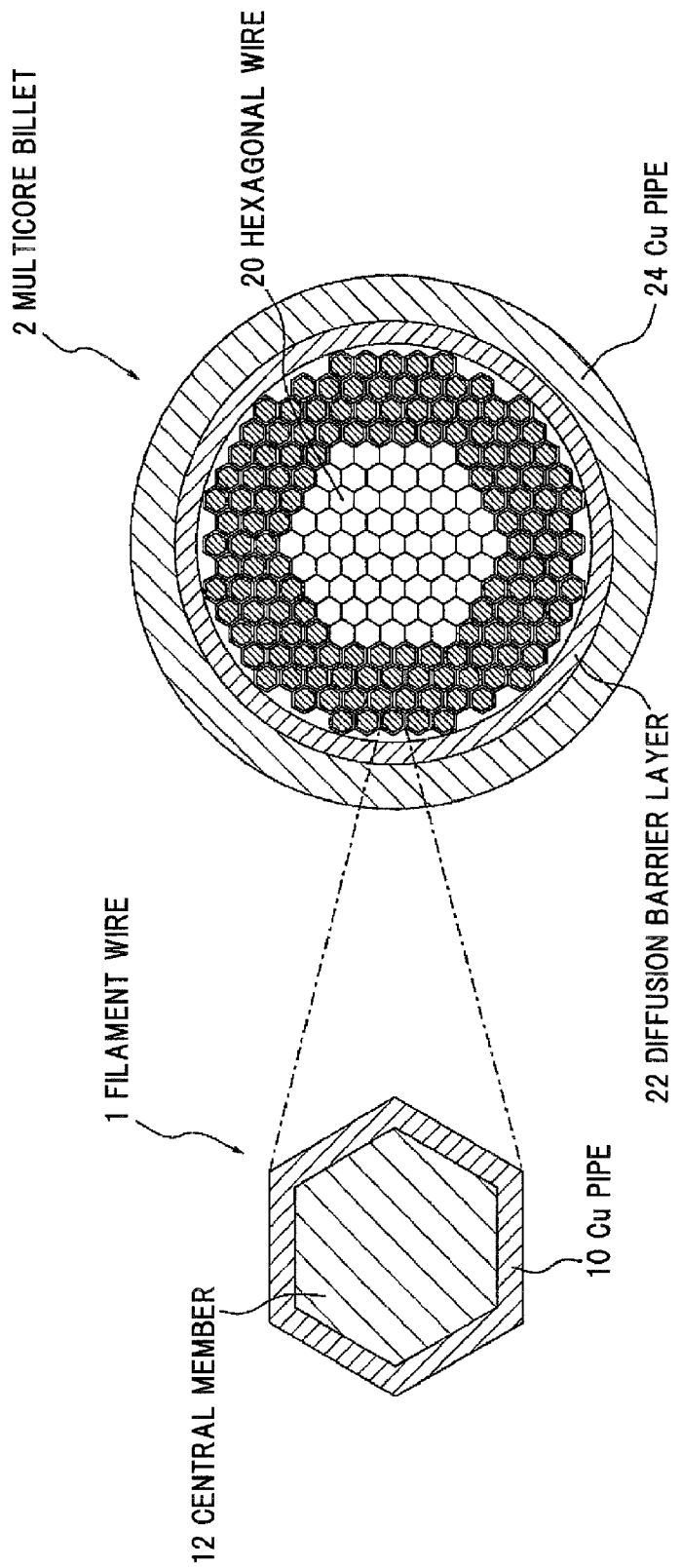
FIG. 3 is a cross sectional view showing a $Nb_3Sn$ superconducting wire rod in Example 1.

FIG. 3 is a cross sectional view showing a Nb$_3$Sn superconducting wire rod in Example 1.

In Example 1, Nb/Cu filament wires 1 having a hexagonal cross section (1 mm opposite side distance) are first fabricated by wire drawing of Cu pipes 10 (outside diameter □020 mm, inside diameter □19 mm, □018 mm, □15.6 mm, □12.6 mm, and □10.6 mm) having inserted and built thereinto Nb rods having outside diameters slightly smaller than the inside diameters of the Cu pipes 10 respectively. In this Nb/Cu filament wires 1, the cross section ratios of Nb and Cu for a central member 12 are equivalent to atomic number ratios of Nb and Cu, x=0.858, 0.736, 0.504, 0.301, and 0.204, respectively.

In the same manner as above, hexagonal wires 20 are also fabricated by wire drawing of Sn alloy rods with a 2 weight % of Ti added to Sn (Sn-2 weight % Ti alloy rods) so that the hexagonal opposite side distance is 1 mm. A multicore billet 2 is then fabricated by building numbers shown in Table 1 of the Nb/Cu and Sn alloy hexagonal wires 1 and 20 into a Cu pipe 24 (outside diameter □38 mm, inside diameter □31.5 mm).

TABLE 1

| | Sample No. | Nb/Cu diameter ratio | No. of Nb/Cu cores | No. of Sn cores | a | b | x | y | Jc@12T (A/mm$^2$) | Void |
|---|---|---|---|---|---|---|---|---|---|---|
| Comparative example | a | 0.53 | 606 | 139 | 0.35 | 0.0499 | 0.204 | 0.111 | 960 | |
| Comparative example | b | 0.63 | 534 | 211 | 0.41 | 0.110 | 0.301 | 0.200 | 1030 | |
| Example | c | 0.63 | 558 | 187 | 0.39 | 0.0748 | 0.301 | 0.170 | 1380 | |
| Example | d | 0.63 | 606 | 139 | 0.31 | 0.0326 | 0.301 | 0.116 | 1360 | |

TABLE 1-continued

| Sample No. | | Nb/Cu diameter ratio | No. of Nb/Cu cores | No. of Sn cores | a | b | x | y | Jc@12T (A/mm$^2$) | Void |
|---|---|---|---|---|---|---|---|---|---|---|
| Comparative example | e | 0.63 | 624 | 121 | 0.29 | 0.0156 | 0.301 | 0.098 | 1000 | |
| Comparative example | f | 0.78 | 510 | 235 | 0.41 | 0.0972 | 0.504 | 0.255 | 1500 | With voids |
| Example | g | 0.78 | 522 | 223 | 0.39 | 0.0800 | 0.504 | 0.236 | 2180 | |
| Example | h | 0.78 | 576 | 181 | 0.31 | 0.0428 | 0.504 | 0.178 | 2210 | |
| Comparative example | i | 0.78 | 584 | 161 | 0.29 | 0.0127 | 0.504 | 0.152 | 1710 | |
| Comparative example | j | 0.90 | 480 | 265 | 0.41 | 0.126 | 0.736 | 0.335 | 2060 | Many voids |
| Example | k | 0.90 | 492 | 253 | 0.39 | 0.0943 | 0.736 | 0.312 | 3000 | With voids |
| Example | l | 0.90 | 534 | 211 | 0.31 | 0.0436 | 0.736 | 0.240 | 3000 | |
| Comparative example | m | 0.90 | 546 | 199 | 0.29 | 0.0289 | 0.736 | 0.221 | 2230 | |
| Comparative example | n | 0.95 | 504 | 241 | 0.35 | 0.0224 | 0.858 | 0.304 | 1760 | Many voids |

Also, a 0.1 mm thick Ta sheet is wrapped seven times between the Cu pipe 24 and the hexagonal wires 20, to form a diffusion barrier layer 22 to prevent the Sn from diffusing to the outer Cu pipe 24. The Sn ratio y is the value shown in Table 1, by setting the numbers of the Nb/Cu and Sn alloy hexagonal wires 1 and 20 built in to the numbers shown in Table 1. With the above-mentioned x values, multicore billets 2 are fabricated as total 14 samples (a, b, . . . n) of Nb$_3$Sn superconducting wire rods in Example 1.

Figure 4:
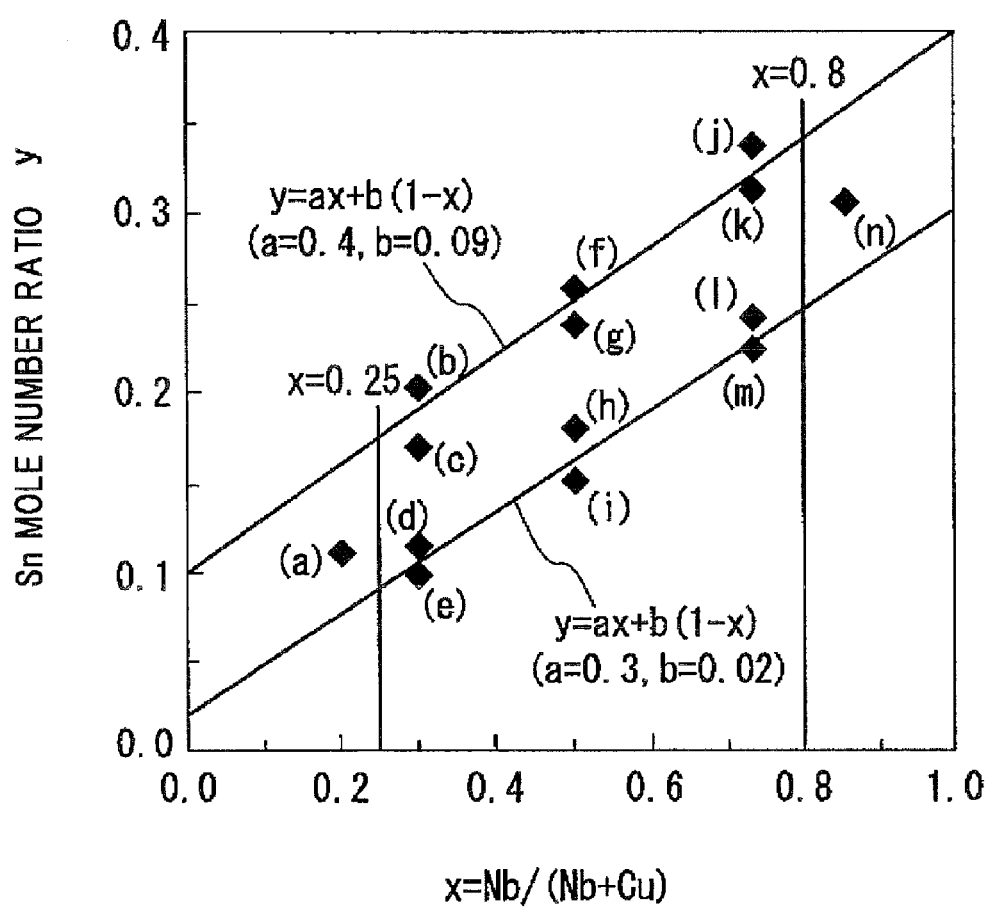
FIG. 4 is a diagram showing a Sn ratio range in the $Nb_3Sn$ superconducting wire rods in Example 1.

FIG. 4 shows a Sn ratio range in the Nb$_3$Sn superconducting wire rods in Example 1.

Specifically, FIG. 4 shows graphs in which the Nb ratios x and the Sn ratios y of the samples fabricated in Example 1 are plotted. Of the 14 samples, the samples (c), (d), (g), (h), (k), and (l) exist within the composition range prescribed in the embodiment, while the samples (b), (f), and (j) exist in the upper side relative to that composition range, i.e. the Sn ratios y of the samples (b), (f), and (j) are higher than that composition range. Also, the Sn ratios y of the samples (e), (i), and (m) are lower than that composition range. Further, the sample (a) is smaller in the Nb ratio x than the composition range prescribed in the embodiment, while the sample (n) is greater in the Nb ratio x than that composition range.

The multicore billets 2 fabricated are drawn to have a wire diameter of □1 mm, and thereafter partially heated in the conditions of from 650 to 750° C. and from 100 to 200 hours, to thereby produce Nb$_3$Sn. The samples heated are placed in a liquid helium at a temperature of 4.2 K to apply a 12 T magnetic field to measure critical current density (Jc) values of the samples. The critical current density (Jc) value results measured are also tabulated in Table 1.

The critical current density (Jc) is enhanced with increasing Nb ratio x because the resulting Nb$_3$Sn increases with increasing number of Nb filaments built in. As this is considered as being self-evident, herein are compared the samples having the same Nb ratio x value.

First, for the samples (b) to (e) at x=0.3, the critical current densities (Jc) of the samples (c) and (d) are 1380 A/mm$^2$ and 1360 A/mm$^2$, respectively. However, the critical current densities (Jc) of the samples (b) and (e) are lower than the critical current densities (Jc) of the samples (c) and (d), and are approximately 1000 A/mm$^2$. The high critical current densities (Jc) can be achieved within the composition range prescribed in the present embodiment.

Also, for the samples (f) to (i) at x=0.5, the critical current densities (Jc) of the samples (g) and (h) within the composition range prescribed in the present embodiment are around 2200 A/mm$^2$, whereas the critical current densities (Jc) of the samples (f) and (i) are 1500 A/mm$^2$ and 1710 A/mm$^2$, respectively. For the samples (j) to (m) at x=0.74, the samples (k) and (l) within the composition range prescribed in the present embodiment have the high critical current density (Jc) of 3000 A/mm$^2$.

On the other hand, the critical current density (Jc) of the sample (a) at x=0.2 smaller than the composition range prescribed in the embodiment is as low as 960 A/mm$^2$. Also, the critical current density (Jc) of the sample (n) at x=0.85 greater than that composition range is low compared with the samples (k) and (l) within the composition range prescribed in the present embodiment, and there are observed voids in its cross section.

As described above, the high critical current density (Jc) Nb$_3$Sn superconducting wire rod can be fabricated by setting the Sn mole number ratio within the composition range prescribed in the present embodiment.

Modification to Example 1

Figure 5:
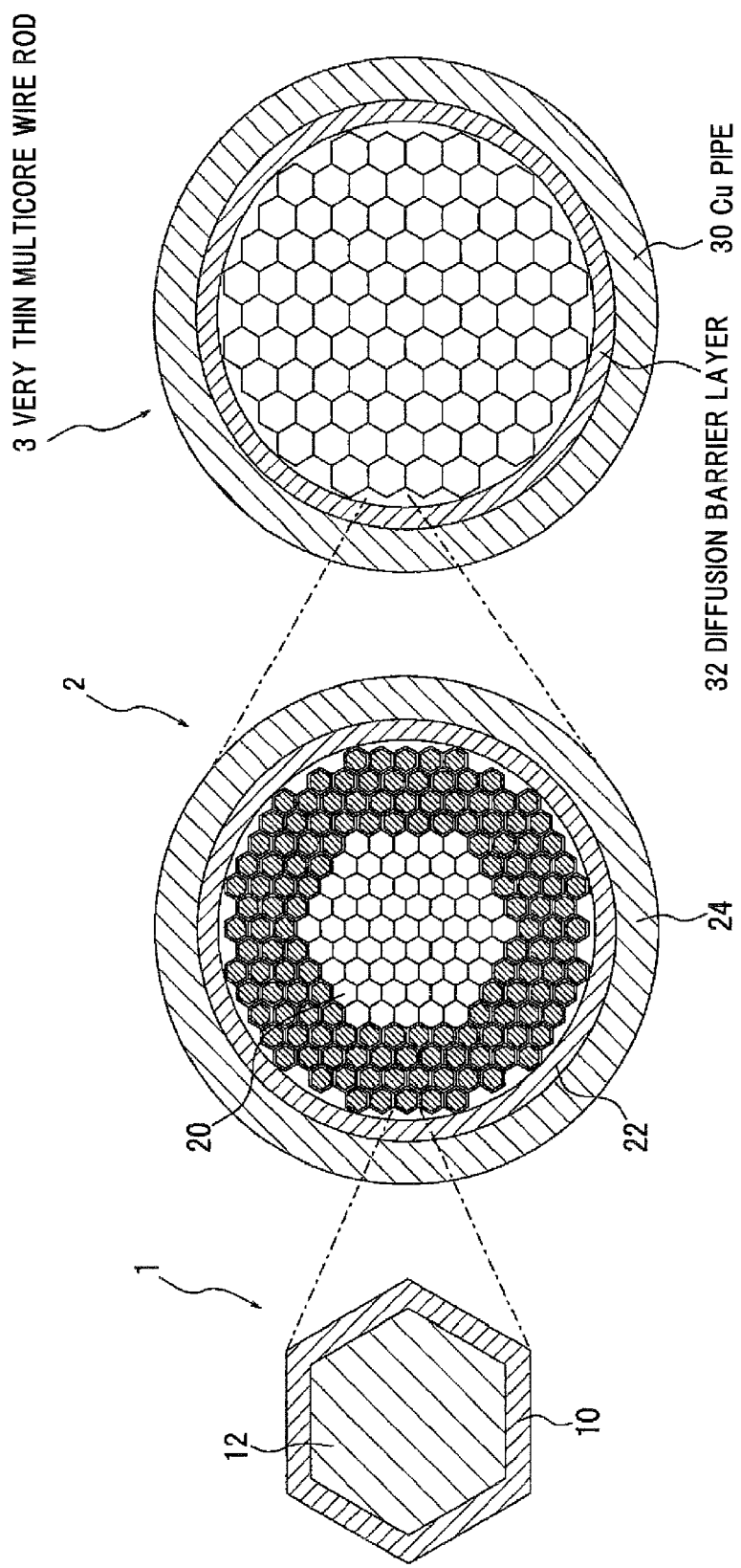
FIG. 5 is a cross sectional view showing a $Nb_3Sn$ superconducting wire rod in a modification to Example 1.

FIG. 5 is a schematic cross sectional view showing a Nb$_3$Sn superconducting wire rod in a modification to Example 1.

The Nb$_3$Sn superconducting wire rod in the modification to Example 1 is fabricated as follows. The Nb$_3$Sn superconducting wire rod in Example 1 is first drawn. A specified number of drawn Nb$_3$Sn superconducting wire rods in Example 1 are then bound and inserted into a Cu pipe 30, to thereby produce a very thin multicore wire rod 3. A diffusion barrier layer 32 for inhibiting Nb diffusion is then provided between the Cu pipe 30 and the drawn Nb$_3$Sn superconducting wire rods in Example 1. Also, the composition range prescribed in the present embodiment applies in the modification to Example 1

Example 2

A Nb$_3$Sn superconducting wire rod in Example 2 is produced, using the Nb tube method.

Figure 6:
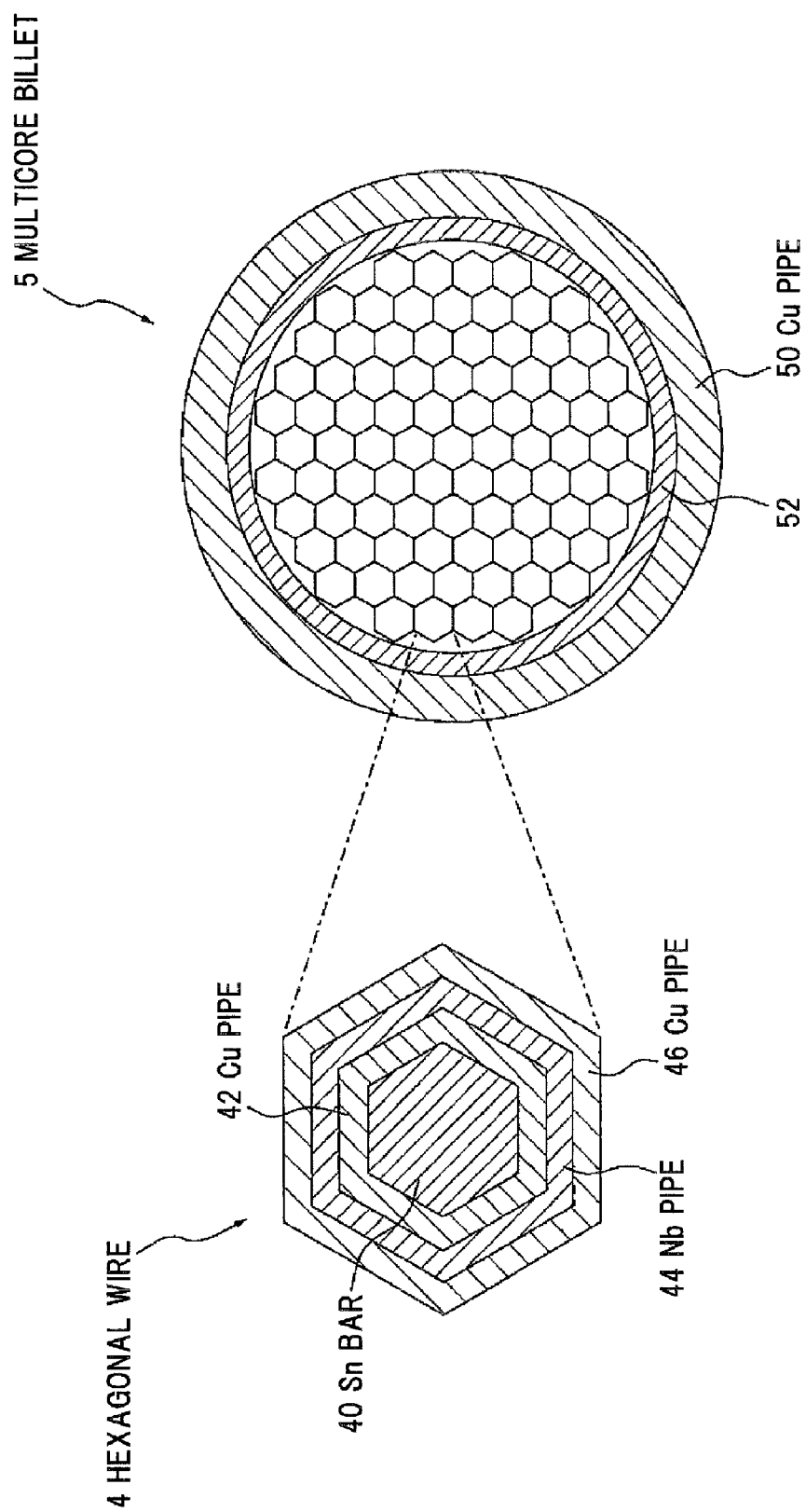
FIG. 6 is a cross sectional view showing a $Nb_3Sn$ superconducting wire rod in Example 2.

FIG. 6 is a schematic cross sectional view showing a Nb$_3$Sn superconducting wire rod in Example 2.

In Example 2, a Sn rod 40 (outside diameter 10 mm) is first inserted into a Cu pipe 42 (outside diameter 15 mm, inside diameter 10 mm). This is inserted into a Nb pipe 44 (outside diameter 20 mm, inside diameter 15 mm). Further, this is built into a Cu pipe 46 (outside diameter 24 mm, inside diameter 20 mm). This entire wire rod is then drawn into a hexagonal wire 4 having a hexagonal opposite side distance of 1.0 mm. 745 hexagonal wires 4 are inserted into a Cu pipe 50 (outside diameter 38 mm, inside diameter 31.5 mm). A 0.7 mm thick diffusion barrier layer 52 formed of Nb is formed on an inner surface of the Cu pipe 50. This results in a multicore billet 5.

The inner member relative to the barrier not including the Nb barrier layer 52 has a volume ratio of Nb: 43.8%, Cu: 31.3%, and Sn: 24.9%; a mole ratio of Nb: 40.5%, Cu: 44.2%, and Sn: 15.3%, proportional coefficients of a=0.333 and b=0.042; and a Nb ratio of x=0.48. The multicore billet 5 fabricated is then partially heated in the conditions of from 650 to 750° C. and from 100 to 200 hours, to thereby produce $Nb_3Sn$. The sample heated is placed in a liquid helium at a temperature of 4.2 K to apply a 12 T magnetic field to measure critical current density (Jc) value of the sample. The critical current density (Jc) value result measured has shown as very high a non-Cu Jc property as approximately 3000 $A/mm^2$.

Example 3

A $Nb_3Sn$ superconducting wire rod in Example 3 is produced, using the Jelly Roll method.

Figure 7:
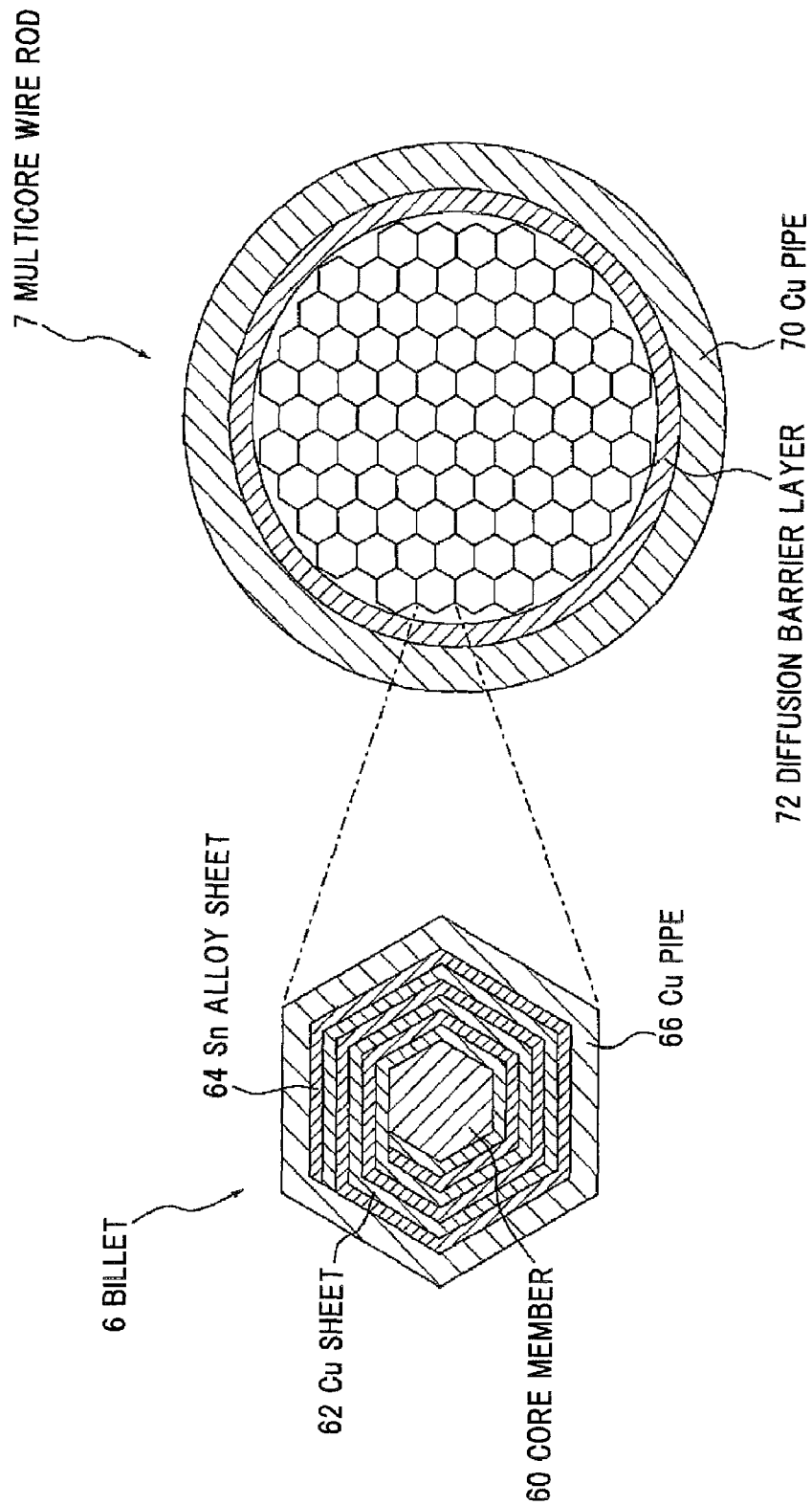
FIG. 7 is a cross sectional view showing a $Nb_3Sn$ superconducting wire rod in Example 3.

FIG. 7 is a schematic cross sectional view showing a $Nb_3Sn$ superconducting wire rod in Example 3.

In Example 3, a Jelly Roll layer is first formed by using a Cu rod (diameter 8 mm) for a core material 60, and wrapping 24 times therearound a laminate of a 160 µm thick Cu sheet 62 and a 90 µm thick Sn alloy sheet 64 (composition: Sn-2.0 weight % Ti). This is inserted into a Cu pipe 66 (outside diameter 20 mm, inside diameter 16 mm) for a stabilization material, to produce a billet 6. This billet 6 is drawn to form a wire rod having a hexagonal cross section (1.0 mm opposite side distance). This wire rod is cut at a specified length. 745 wire rods are likewise formed and bound, and a 0.1 mm thick Ta sheet is wrapped three times therearound as a diffusion barrier layer 72 to prevent the Sn from diffusing into its outer portion. This wire rods are built into a Cu pipe 70 (outside diameter 38 mm, inside diameter 31.5 mm) for a stabilization material. By wire drawing of this, a multicore wire rod 7 (diameter 1 mm) is fabricated.

The inner member relative to the barrier not including the Nb barrier layer 72 has a volume ratio of Nb: 48.0%, Cu: 25.0%, and Sn: 27.0%; a mole ratio of Nb: 46.0%, Cu: 36.7%, and Sn: 17.3%, proportional coefficients of a=0.333 and b=0.050; and a Nb ratio of x=0.56.

The multicore billet 7 fabricated is partially heated in the conditions of from 650 to 750° C. and from 100 to 200 hours, to thereby produce $Nb_3Sn$. The sample heated is placed in a liquid helium at a temperature of 4.2 K to apply a 12 T magnetic field to measure critical current density (Jc) value of the sample. The critical current density (Jc) value result measured is as very high a non-Cu Jc as approximately 3000 $A/mm^2$, showing that the raw material ratio is improved by the constituent ratio prescribed in the present embodiment.

Although the invention has been described with respect to the above embodiments, the above embodiments are not intended to limit the appended claims. Also, it should be noted that not all the combinations of the features described in the above embodiments are essential to the means for solving the problems of the invention.

What is claimed is:

1. A method of producing a $Nb_3Sn$ superconducting wire rod, comprising:
   forming a wire rod comprising Nb, Sn and Cu, and having a mole ratio of the Sn expressed as ax+b(1−x), where 0.25≦x≦0.8, 0.3≦a≦0.4 and 0.02≦b≦0.1, and x and 1−x are prescribed as a mole ratio of the Nb and a mole ratio of the Cu, respectively, to a total of a mole number of the Nb and a mole number of the Cu; and
   heating the wire rod to produce $Nb_3Sn$ from the Sn and the Nb.

2. The method according to claim 1, wherein
   by the heating of the wire rod, a Cu—Sn alloy is produced from the Sn and the Cu, concurrently with the $Nb_3Sn$ produced from the Sn and the Nb.

3. A $Nb_3Sn$ superconducting wire rod, comprising:
   Nb, Sn, and Cu, the superconducting wire rod having a mole ratio of the Sn expressed as ax+b(1−x), where 0.25≦x≦0.8, 0.3≦a≦0.4 and 0.02≦b≦0.1, and x and 1−x are prescribed as a mole ratio of the Nb and a mole ratio of the Cu, respectively, to a total of a mole number of the Nb and a mole number of the Cu.

* * * * *